United States Patent
Kim

(10) Patent No.: US 11,287,476 B2
(45) Date of Patent: Mar. 29, 2022

(54) SYSTEM AND METHOD FOR DIAGNOSING CONTACTOR LIFETIME BY USING CONTACTOR COIL CURRENT

(71) Applicant: LG Chem, Ltd., Seoul (KR)

(72) Inventor: Jinhwan Kim, Daejeon (KR)

(73) Assignee: LG Energy Solution, Ltd.

( * ) Notice: Subject to any disclaimer, the term of this patent is extended or adjusted under 35 U.S.C. 154(b) by 123 days.

(21) Appl. No.: 16/634,746

(22) PCT Filed: Oct. 8, 2018

(86) PCT No.: PCT/KR2018/011845
§ 371 (c)(1),
(2) Date: Jan. 28, 2020

(87) PCT Pub. No.: WO2019/074254
PCT Pub. Date: Apr. 18, 2019

(65) Prior Publication Data
US 2020/0209312 A1 Jul. 2, 2020

(30) Foreign Application Priority Data

Oct. 12, 2017 (KR) .................. 10-2017-0132631

(51) Int. Cl.
*G01R 31/327* (2006.01)
*G01R 19/165* (2006.01)
(Continued)

(52) U.S. Cl.
CPC ......... *G01R 31/327* (2013.01); *G01R 19/165* (2013.01); *G01R 19/32* (2013.01); *H01H 1/0015* (2013.01)

(58) Field of Classification Search
CPC .. G01R 31/00; G01R 31/327; G01R 31/3277; G01R 31/3278; G01R 31/50;
(Continued)

(56) References Cited

U.S. PATENT DOCUMENTS 6,225,807 B1  5/2001 Pohl
6,744,609 B2 * 6/2004 Hiwatari ............. H02H 7/0851
                                                          361/24
(Continued)

FOREIGN PATENT DOCUMENTS

CN    104345270 A    2/2015
CN    204215013 U    3/2015
(Continued)

OTHER PUBLICATIONS

Search report from International Appllication No. PCT/KR2018/011845 dated Jan. 11, 2019.
(Continued)

*Primary Examiner* — Hoai-An D. Nguyen
(74) *Attorney, Agent, or Firm* — Lerner, David, Littenberg, Krumholz & Mentlik, LLP

(57) ABSTRACT

A system and a method for diagnosing a contactor life using contactor coil current, whereby, after a current value of a current contactor coil is determined based on a resistance value and a voltage value according to a real-time temperature of a contactor coil, whether contactor lifetime has expired and an abnormal operation thus occurs can be previously diagnosed and predicted on the basis of whether an average current value when a corresponding contactor operates a preset number of times or more exceeds a threshold value.

12 Claims, 2 Drawing Sheets

(51) Int. Cl.
  G01R 19/32 (2006.01)
  H01H 1/00 (2006.01)
(58) Field of Classification Search
  CPC ...... G01R 31/72; G01R 19/00; G01R 19/165;
       G01R 19/32; H01H 1/00; H01H 1/0015;
       H01F 7/00; H01F 7/06; H01F 7/08; H01F
       7/18; H01F 7/1844
  USPC ............ 324/415–424; 361/1, 93.1, 101, 102,
       361/103, 435
  See application file for complete search history.

(56) References Cited

U.S. PATENT DOCUMENTS

| | | | |
|---|---|---|---|
| 6,917,203 | B1 | 7/2005 | Perotti et al. |
| 9,506,992 | B2* | 11/2016 | Baraszu ............ G01R 31/3648 |
| 2005/0275993 | A1* | 12/2005 | Phillips .................... H02H 5/04 |
| | | | 361/103 |
| 2007/0165349 | A1 | 7/2007 | Parker |
| 2008/0074215 | A1 | 3/2008 | Zhou et al. |
| 2013/0103334 | A1 | 4/2013 | Delbaere et al. |
| 2013/0278269 | A1 | 10/2013 | Steck et al. |
| 2019/0039458 | A1* | 2/2019 | Ryu ...................... B60L 3/0076 |
| 2019/0131047 | A1* | 5/2019 | Priest .................. H01H 47/002 |

FOREIGN PATENT DOCUMENTS

| | | | |
|---|---|---|---|
| CN | 104656015 | A | 5/2015 |
| CN | 204515085 | U | 7/2015 |
| EP | 2584366 | A2 | 4/2013 |
| JP | H05011277 | U | 2/1993 |
| JP | 2000111595 | A | 4/2000 |
| JP | 2006136161 | A | 5/2006 |
| JP | 2014500570 | A | 1/2014 |
| KR | 20030083329 | A | 10/2003 |
| KR | 20040059527 | A | 7/2004 |
| KR | 20080002426 | U | 7/2008 |
| KR | 20080071100 | A | 8/2008 |
| KR | 100882787 | B1 | 2/2009 |
| KR | 20130044187 | A | 5/2013 |
| KR | 101389434 | B1 | 4/2014 |
| KR | 20150089638 | A | 8/2015 |
| KR | 20170062739 | A | 6/2017 |

OTHER PUBLICATIONS

Angadi S V et al: "Reliability and life study of hydraulic solenoid valve. Part 2: Experimental study", Engineering Failue Analysis, Pergamon, vol. 16, No. 3, pp. 944-963.

Extended European Search Report for Application No. EP18866820.6 dated Jul. 16, 2020, 3 pgs.

Chinese Search Report for Application No. 201880044326.0 dated May 21, 2021, pp. 1-3.

He, Y., "Selection and Analysis of Common Failures for Electromagnetic AC Contactor", Guangxi Journal of Light Industry, Dec. 2011, 1 Page. (English Abstract Only).

Wang, L. et al., "Research on Measurement and Control Technology of Electrical Operation Test for AC Contactor", Electrical & Energy Management Technology, Dec. 2015, 1 Page. (English Abstract Only).

* cited by examiner

[Figure 1]
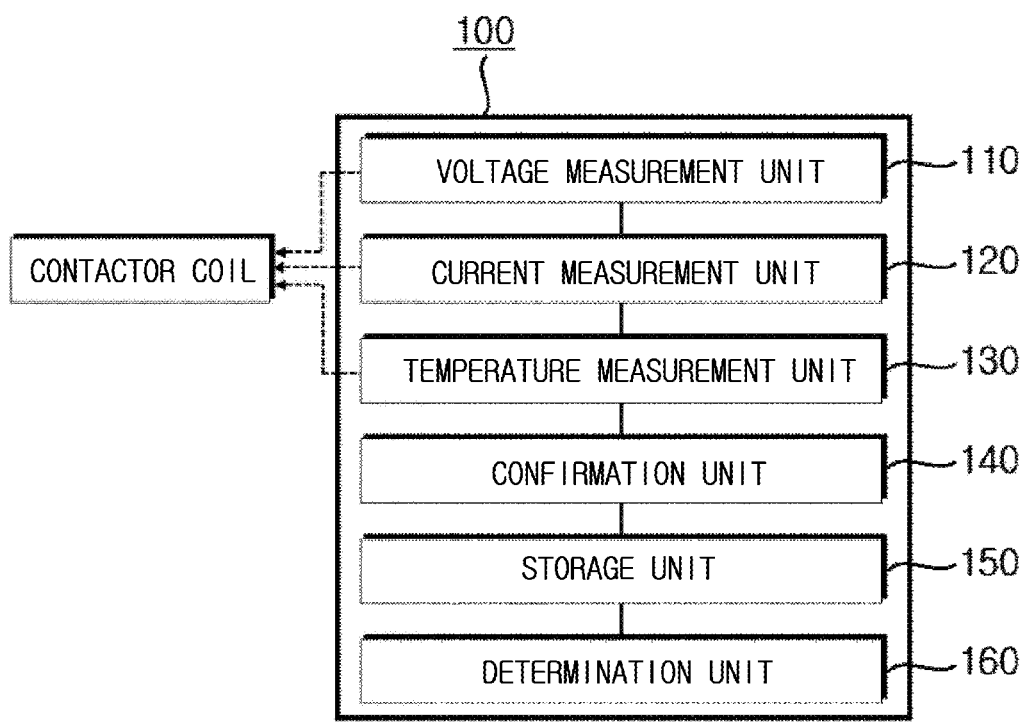

[Figure 2]
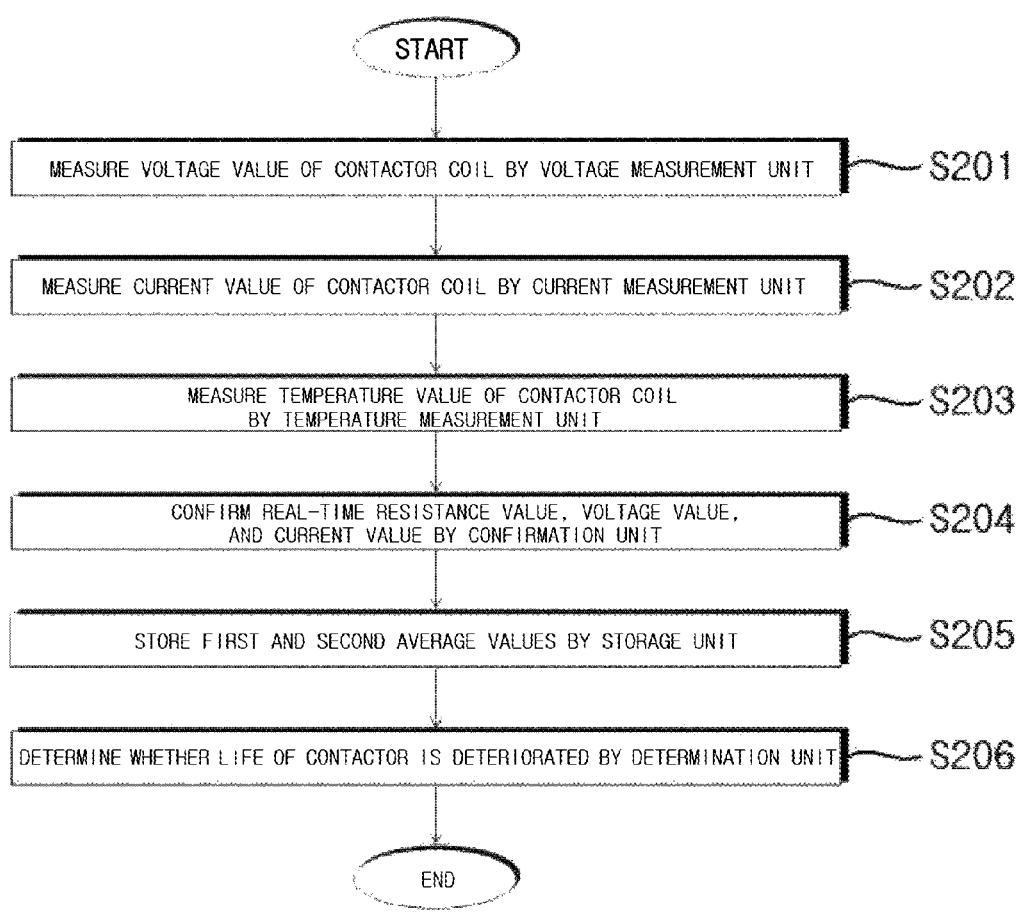

SYSTEM AND METHOD FOR DIAGNOSING CONTACTOR LIFETIME BY USING CONTACTOR COIL CURRENT

CROSS-REFERENCE TO RELATED APPLICATIONS

The present application is a national phase entry under 35 U.S.C. § 371 of International Application No. PCT/KR2018/011845 filed on Oct. 8, 2018, which claims priority from Korean Patent Application No. 10-2017-0132631 filed on Oct. 12, 2017, the entire contents of which are incorporated herein by reference.

TECHNICAL FIELD

The present invention relates to a system and a method for diagnosing a contactor life using contactor coil current, and more particularly, to a system and a method for diagnosing a contactor life using contactor coil current. Specifically, after the current value of the current contactor coil is determined based on a resistance value and a voltage value according to a real-time temperature of a contactor coil, whether a malfunction occurs due to contactor lifetime has expired can be previously diagnosed and predicted based on whether the average current value when a corresponding contactor operates at set number of times or more exceeds a threshold value.

BACKGROUND ART

In general, among various elements mounted on a circuit, in particular, a diagnostic method of contactor includes a method for calculating a damage relationship between a current and a contactor, which occurs when a contactor is turned on or off (or opened or closed). Because the conventional method used predicting the lifespan of a contactor that may beguaranteed by the contactor, there was a problem in that a lot of errors occurred depending on the type of the contactor, which is disadvantageous in that it is difficult to expect an accurate life expectancy of the contactor.

In particular, since current flowing through a contactor coil may vary depending on the real-time voltage and the real-time temperature of the contactor coil, the real-time current flowing through the contactor coil may not be accurately confirmed, and as a result, there is a high possibility of misdiagnosis in diagnosing the life expentancy of the contactor.

Therefore, in order to solve various problems and limitations which occur in the process of diagnosing the contactor in the conventional art, the present inventors developed a system and a method for diagnosing the life expectancy of a contactor based on the resistant value and the voltage value according to the real-time temperature of the contactor coil to confirm the current value of the contactor coil. After that, whether a malfunction occurs due to the life of a contactor has expired can be diagnosed and predicted in advance based on whether an average current value when a corresponding contactor operates at set number of times or more exceeds a threshold value.

DETAILED DESCRIPTION OF THE INVENTION

Technical Problem

The present invention is contrived to solve the problem and the present invention has been made in an effort to provide a system and a method for diagnosing the life of a contactor using contactor coil current, which may confirm a current value of the current contactor coil based on the resistance value and the voltage value according to the real-time temperature of a contactor coil and then, diagnose and predict in advance whether a malfunction occurs due to the life e of a contactor based on whether an average current value when the corresponding contactor operates at a set number of times or more exceeds a threshold value.

Technical Solution

A system for diagnosing the life of a contactor using a contactor coil current according to an embodiment of the present invention may include: a voltage measurement unit for measuring a voltage of a contactor coil for a contactor; a current measurement unit for measuring a current of the contactor coil; a temperature measurement unit for measuring a temperature of the contactor coil; a confirmation unit for confirming a real-time resistance value, a real-time voltage value, and a real-time current value for the contactor coil based on a temperature measurement value measured through the temperature measurement unit; a storage unit for storing an average value of current measured when the contactor operates to correspond to a predetermined number of times; and a determination unit for determining whether a life of the contactor is deteriorated based on whether the average value stored in the storage unit exceeds a predetermined threshold current value.

In an embodiment, the current measurement unit may measure the current of the contactor coil when the contactor operates from an on state to an off state.

In an embodiment, the confirmation unit may confirm the real-time resistance value and the real-time voltage value according to the measured temperature measurement value based on a resistance value table which a resistance value of the contactor coil for each temperature value is matched with and is prestored in.

In an embodiment, the confirmation unit may confirm a calculation value calculated by the following equation as the real-time current value.

[Equation] $I=V/R$ Here, V denotes the real-time voltage value and R denotes the real-time resistance value.

In an embodiment, the storage unit may store an average value of current measured when the contactor operates 50 times as a first average value and store an average value of current measured when the contactor additionally operates 10 times after 50-time operations as a second average value.

In an embodiment, when at least one of the first average value and the second average value exceeds the threshold current value, the determination unit may determine that a malfunction has occurred in the contactor and generates a warning signal. And when the first average value and the second average value do not exceed the threshold current value, it is determined that the malfunction has not occurred in the contactor and the second average value additional storing signal is additionally stored in the storage unit.

In the embodiment, the threshold current value may be 50 mA.

A method for diagnosing a contactor life using a contactor coil current according to another embodiment of the present invention may include: measuring, by a voltage measurement unit, voltage of a contactor coil for a contactor; measuring, by a current measurement unit, current of the contactor coil; measuring, by a temperature measurement unit, a temperature of the contactor coil; confirming, by a confirmation unit, a real-time resistance value, a real-time voltage value, and a real-time current value for the contactor coil based on a temperature measurement value measured through the temperature measurement unit; storing, by a storage unit, an average value of current measured when the contactor operates to correspond to a predetermined number of times; and determining, by a determination unit, whether a life of the contactor is deteriorated based on whether the average value stored in the storage unit exceeds a predetermined threshold current value.

In an embodiment, the measuring of the current of the contactor coil may include measuring, by the current measurement unit, the current of the contactor coil when the contactor operates from an on state to an off state.

In an embodiment, the confirming of the real-time resistance value, the real-time voltage value, and the real-time current value may include confirming, by the confirmation unit, the real-time resistance value and the real-time voltage value according to the measured temperature measurement value based on a resistance value table which a resistance value of the contactor coil for each temperature value is matched with and is prestored in.

In an embodiment, the storing of the average value of the current measured when the contactor operates to correspond to the predetermined number of times may include storing, by the storage unit, an average value of current measured when the contactor operates 50 times as a first average value, and storing, by the storage unit, an average value of current measured when the contactor additionally operates 10 times after 50-time operations as a second average value.

In an embodiment, the determining of whether a malfunction of the contactor has occured may include determining, by the determination unit, that the malfunction has occured in the contactor when at least one of the first average value and the second average value exceeds the threshold current value and generates a warning signal. And when the first average value and the second average value do not exceed the threshold current value, it is determined that the malfunction has not occurred in the contactor and the second average value additional storing signal is additionally stored in the storage unit.

Advantageous Effects

According to an aspect of the present invention, it is possible to confirm a current value of a current contactor coil based on a resistance value and a voltage value according to a real-time temperature of a contactor coil and then, diagnose and predict in advance whether a malfunction occurs due to the life expectancy of a contactor based on whether an average current value when the contactor is operated more than at set number of times or more exceeds a threshold value.

BRIEF DESCRIPTION OF DRAWINGS

FIG. 1 is a diagram schematically illustrating a configuration of a system 100 for diagnosing a contactor life using a contactor coil current according to an embodiment of the present invention.

FIG. 2 is a diagram illustrating, in order, a series of processes for diagnosing a life of a contactor using the system 100 for diagnosing a contactor life using contactor coil current illustrated in FIG. 1.

BEST MODE

Hereinafter, a preferred embodiment is presented in order to assist understanding of the present invention. However, the following embodiment is just provided to more easily understand the present invention and contents of the present invention are not limited by the embodiment.

FIG. 1 is a diagram schematically illustrating a configuration of a system 100 for diagnosing a contactor life using a contactor coil current according to an embodiment of the present invention.

Referring to FIG. 1, the system 100 for diagnosing a contactor life using a contactor coil current according to an embodiment of the present invention may be configured to generally include a voltage measurement unit 110, a current measurement unit 120, a temperature measurement unit 130, a confirmation unit 140, a storage unit 150, and a determination unit 160.

The voltage measurement unit 110 may serve to measure a voltage value of a contactor coil for a contactor and in this case, since any means capable of measuring the voltage value may be applied, a type thereof is not limited.

The current measurement unit 120 may serve to measure a current value of the contactor coil and in this case, when the contactor operates from an ON state to an OFF state (when a state is transitioned), the current measurement unit 120 may measure the current value of the contactor coil.

Likewise, the current measurement unit 120 may adopt any means capable of measuring the current value, so that the type thereof is not limited.

The temperature measurement unit 130 may serve to measure a temperature value of the contactor coil.

Generally, the resistance value of the contactor coil depends on the temperature value of the contactor coil and in the present invention, the resistance value of the contactor coil is used to predict the life of the contactor. This is to be described later and likewise, the temperature measurement unit 130 may adopt any means capable of measuring the temperature value, so that the type thereof is not limited.

The confirmation unit 140 may serve to confirm a real-time resistance value, a real-time voltage value, and a real-time current value for the contactor coil based on a temperature measurement value measured through the temperature measurement unit 130.

More specifically, the confirmation unit 140 may use a resistance value table in which a resistance value of the contactor coil for each temperature value is matched and is prestored and in general, in the contact coil, as damage increases, the number of resistance components may increase and in this case, as the number of resistance components increases, heat emitted from the contactor coil increases.

Therefore, the confirmation unit 140 confirms a current real-time resistance value and a real-time voltage value using the heat emitted from the contactor coil and the resistance value of the contactor coil.

Meanwhile, the confirmation unit 140 may confirm the real-time current value using an operation value calculated by the following equation.

$$I = V/R \qquad \text{[Equation]}$$

Here, I denotes the real-time current value of the current conducted to the contactor coil, V denotes the real-time voltage value conducted to the contactor coil, and R denotes the real-time voltage value of the contactor coil.

That is, the real-time current value may be confirmed in an inverse proportion relationship equation of the real-time voltage value and the real-time resistance value and the real-time current value confirmed by the confirmation unit 140 may be delivered to the storage unit 150 to be described later.

The storage unit 150 may serve to store an average value of current measured when the contactor operates to correspond to a predetermined number of times.

More specifically, when the contactor operates to correspond to 50 times, the storage unit 150 obtains an average of the measured current value (the real-time current value confirmed by the confirmation unit 140), and stores the obtained average as a first average value, and when the contact additionally operates 10 times after 50-time operations, the storage unit 150 obtains an average of the measured current value (the real-time current value confirmed by the confirmation unit 140) and stores the obtained average as a second average value.

That is, the storage unit 150 stores the average value of the current value of the contactor and stores a change in life of the contactor according to the elapse of time by storing the average value in two steps.

The determination unit 160 may determine whether the contactor malfunctions based on whether the first average value and the second average value prestored in the storage unit 150 exceed a predetermined threshold current value.

Here, the predetermined threshold current value may mean, for example, 50 mA, and when at least one of the first average value and the second average value exceeds 50 mA, the determination unit 160 determines that the life of the contactor is deteriorated and determines that there is a concern of occurrence of the malfunction of the corresponding contactor, thereby generating a warning signal.

On the contrary, when the first and second average values do not exceed the threshold current value, the determination unit 160 determines that the life of the contactor is not deteriorated and determines that there is no concern of the occurrence of the malfunction of the contactor to deliver a second average value additional storing signal to additionally store the second average value in the storage unit 150.

Accordingly, the storage unit 150 additionally obtains and stores the average of the current value according to 10-time additional operations of the contactor 10 and the determination unit 160 repeatedly determines whether a newly added second average value exceeds the threshold current value.

Next, a series of processes for diagnosing the life of the contactor using the system 100 for diagnosing a contactor life using contactor coil current will be described in order.

FIG. 2 is a diagram illustrating, in order, a series of processes for diagnosing a life of a contactor using the system 100 for diagnosing a contactor life using contactor coil current illustrated in FIG. 1.

Referring to FIG. 2, first, the voltage measurement unit 110 measures the voltage value of the contactor coil for the contactor (S201), the current measurement unit 120 measures the current value of the contactor coil (S202), and the temperature measurement unit 130 measures the temperature value of the contactor coil (S203).

Then, the confirmation unit 140 confirms the real-time resistance value, the real-time voltage value, and the real-time current value for the contactor coil based on the temperature measurement value measured through the temperature measurement unit (S204). In this case, the real-time current value may be calculated through a correlation between the confirmed real-time resistance value and real-time voltage value.

Then, the storage unit 150 stores the average value of the current according to the case where the contactor operates 50 times as the first average value and stores the average value of the current according to the case where the contactor additionally operates 10 times additionally as the second average value (S205).

Then, the determination unit 160 determines whether the life of the contactor is deteriorated based on whether the first average value and the second average value stored in the storage unit 150 exceed a predetermined threshold current value (50 mA) (S206).

The present invention has been described with reference to the preferred embodiments of the present invention, but those skilled in the art will understand that the present invention can be variously modified and changed without departing from the spirit and the scope of the present invention which are defined in the appended claims.

The invention claimed is:

1. A system for diagnosing a contactor life using contactor coil current, the system comprising:
   a voltage measurement unit for measuring a voltage of a contactor coil for a contactor;
   a current measurement unit for measuring a current of the contactor coil;
   a temperature measurement unit for measuring a temperature of the contactor coil;
   a confirmation unit for confirming a real-time resistance value, a real-time voltage value, and a real-time current value for the contactor coil based on a temperature measurement value measured through the temperature measurement unit;
   a storage unit for storing an average value of a current measured when the contactor operates to correspond to a predetermined number of times; and
   a determination unit for determining whether a life of the contactor is deteriorated based on whether the average value stored in the storage unit exceeds a predetermined threshold current value,
   wherein the average value of a current includes a first average value and a second average value, wherein the first average value is calculated based on a first number of contactor operation times and the second average value is calculated based on a second number of contactor operation times, the first number being different from the second number, and
   wherein the confirmation unit confirms the real-time resistance value and the real-time voltage value according to the measured temperature measurement value based on a resistance value table which a resistance value of the contactor coil for each temperature value is matched with and is prestored in.

2. The system of claim 1, wherein the current measurement unit measures the current of the contactor coil when the contactor operates from an on state to an off state.

3. The system of claim 1, wherein the storage unit stores an average value of current measured when the contactor operates 50 times as the first average value and stores an average value of current measured when the contactor additionally operates 10 times after 50-time operations as the second average value.

4. The system of claim 1, wherein the confirmation unit confirms a calculation value calculated by the following equation as the real-time current value:

$$I = V/R \qquad \text{[Equation]}$$

wherein, V denotes the real-time voltage value and R denotes the real-time resistance value.

5. The system of claim 3, wherein when at least one of the first average value or the second average value exceeds the threshold current value, the determination unit determines that a malfunction has occurred in the contactor to generate a warning signal, and when the first average value and the second average value do not exceed the threshold current value, the determination unit delivers a second average value additional storing signal to additionally store the second average value in the storage unit as determining that the malfunction has not occur in the contactor.

6. The system of claim 5, wherein the threshold current value is 50 mA.

7. A method for diagnosing a contactor life based on a contactor coil current, the method comprising:
    measuring, by a voltage measurement unit, a voltage of a contactor coil for a contactor;
    measuring, by a current measurement unit, a current of the contactor coil;
    measuring, by a temperature measurement unit, a temperature of the contactor coil;
    confirming, by a confirmation unit, a real-time resistance value, a real-time voltage value, and a real-time current value for the contactor coil based on a temperature measurement value measured through the temperature measurement unit;
    storing, by a storage unit, an average value of current measured when the contactor operates to correspond to a predetermined number of times; and
    determining, by a determination unit, whether a life of the contactor is deteriorated based on whether the average value stored in the storage unit exceeds a predetermined threshold current value,
    wherein the average value of a current includes a first average value and a second average value, wherein the first average value is calculated based on a first number of contactor operation times and the second average value is calculated based on a second number of contactor operation times, the first number being different from the second number, and
    wherein the confirmation unit confirms the real-time resistance value and the real-time voltage value according to the measured temperature measurement value based on a resistance value table which a resistance value of the contactor coil for each temperature value is matched with and is prestored in.

8. The method of claim 7, wherein the confirmation unit confirms a calculation value calculated by the following equation as the real-time current value:

$$I = V/R$$ [Equation]

wherein, V denotes the real-time voltage value and R denotes the real-time resistance value.

9. The method of claim 7, wherein the measuring of the current of the contactor coil includes measuring, by the current measurement unit, the current of the contactor coil when the contactor operates from an on state to an off state.

10. The method of claim 7, wherein the storing of the average value of the current measured when the contactor operates to correspond to the predetermined number of times includes
    storing, by the storage unit, an average value of current measured when the contactor operates 50 times as the first average value, and
    storing, by the storage unit, an average value of current measured when the contactor additionally operates 10 times after 50-time operations as the second average value.

11. The method of claim 10, wherein the determining of whether a malfunction of the contactor occurs includes
    determining, by the determination unit, that the malfunction has occured in the contactor to generate a warning signal when at least one of the first average value and the second average value exceeds the threshold current value, and
    delivering a second average value additional storing signal to additionally store the second average value in the storage unit as determining, by the determination unit, that the malfunction has not occurred in the contactor when the first average value and the second average value do not exceed the threshold current value.

12. The method of claim 11, wherein the threshold current value is 50 mA.

* * * * *